United States Patent
Takagi et al.

(10) Patent No.: US 9,839,129 B2
(45) Date of Patent: Dec. 5, 2017

(54) COIL COMPONENT AND CIRCUIT BOARD HAVING THE SAME

(71) Applicant: TDK Corporation, Tokyo (JP)

(72) Inventors: Nobuo Takagi, Tokyo (JP); Kouyu Ohi, Yamagata (JP); Tasuku Mikogami, Tokyo (JP); Setu Tsuchida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/395,045

(22) Filed: Dec. 30, 2016

(65) Prior Publication Data
US 2017/0196093 A1 Jul. 6, 2017

(30) Foreign Application Priority Data
Jan. 5, 2016 (JP) ................. 2016-000324

(51) Int. Cl.
| | | |
|---|---|---|
| *H01F 27/28* | (2006.01) | |
| *H05K 1/18* | (2006.01) | |
| *H05K 3/34* | (2006.01) | |
| *H01F 27/24* | (2006.01) | |
| *H01F 27/29* | (2006.01) | |

(52) U.S. Cl.
CPC .............. *H05K 1/181* (2013.01); *H01F 27/24* (2013.01); *H01F 27/2823* (2013.01); *H01F 27/292* (2013.01); *H05K 3/3442* (2013.01); *H05K 2201/1003* (2013.01)

(58) Field of Classification Search
CPC .......... H01F 27/02; H01F 27/06; H01F 27/28; H01F 27/29; H01F 41/10; H01F 41/69; H01F 19/04
USPC .......... 174/260; 336/83, 170, 183, 192, 200; 29/605, 606
See application file for complete search history.

(56) References Cited

U.S. PATENT DOCUMENTS

| | | | | |
|---|---|---|---|---|
| 6,344,784 | B1* | 2/2002 | Murata | H01F 17/0033 336/192 |
| 2008/0309445 | A1* | 12/2008 | Suzuki | H01F 41/069 336/183 |
| 2009/0219127 | A1* | 9/2009 | Tomonari | H01F 27/29 336/192 |
| 2010/0109827 | A1* | 5/2010 | Asou | H01F 17/045 336/192 |
| 2011/0043315 | A1* | 2/2011 | Kobayashi | H01F 27/2828 336/192 |
| 2014/0292463 | A1* | 10/2014 | Lai | H01F 27/29 336/192 |

(Continued)

FOREIGN PATENT DOCUMENTS

JP          2014199906 A     10/2014

*Primary Examiner* — Xiaoliang Chen
(74) *Attorney, Agent, or Firm* — Young Law Firm, P.C.

(57) ABSTRACT

Disclosed herein is a coil component that includes a drum-shaped core having a first flange part provided at one end of a winding core part, first to fourth terminal electrodes formed on the first flange part so as to be arranged in this order in a second direction, and first to fourth wires wound around the winding core part. One ends of the first to fourth wires are connected to different ones of the first to fourth terminal electrodes. The first and second terminal electrodes are not symmetrical with the third and fourth terminal electrodes so that the third and fourth terminal electrodes are offset outward compared with the first and second terminal electrodes.

6 Claims, 7 Drawing Sheets

(56) References Cited

U.S. PATENT DOCUMENTS

| | | | | |
|---|---|---|---|---|
| 2014/0292464 A1* | 10/2014 | Takagi | ............... | H01F 27/29 336/192 |
| 2014/0292465 A1* | 10/2014 | Takagi | ............ | H01F 27/292 336/192 |
| 2015/0287520 A1* | 10/2015 | Takagi | ............... | H01F 27/29 336/170 |
| 2016/0133377 A1* | 5/2016 | Takagi | ............ | H01F 27/2823 336/192 |
| 2017/0011844 A1* | 1/2017 | Mikogami | ......... | H01F 27/2828 |
| 2017/0194085 A1* | 7/2017 | Takagi | ............... | H01F 27/06 |

* cited by examiner

COIL COMPONENT AND CIRCUIT BOARD HAVING THE SAME

BACKGROUND OF THE INVENTION

Field of the Invention

The present invention relates to a coil component and a circuit board having the same and, more particularly, to a coil component using a drum-shaped core and a circuit board having the same.

Description of Related Art

In recent years, electronic components used for an information terminal such as a smartphone are strongly required to reduce the size and particularly height thereof. Thus, a large number of surface-mount type coil components not using a toroidal-shaped core but using a drum-shaped core exist as a coil component such as a pulse transformer. For example, Japanese Patent Application Laid-Open No. 2014-199906 discloses a surface-mount type pulse transformer using a drum-shaped core.

The drum-shaped core of the pulse transformer descried in Japanese Patent Application Laid-Open No. 2014-199906 has a configuration in which the mounting surface at the flange thereof has a concave-convex shape and the end portion of a wire is connected onto the convex part, as illustrated in FIG. 2 of Japanese Patent Application Laid-Open No. 2014-199906. On the other hand, a terminal electrode is not formed on the outer surface of the flange. With such a configuration, when the pulse transformer described in Japanese Patent Application Laid-Open No. 2014-199906 is mounted on a printed circuit board, a solder is formed between a land pattern on the printed circuit board and the convex part of the flange. Since the terminal electrode is not formed on the outer surface of the flange, a solder fillet is not formed on the outer surface.

In recent years, particularly, an on-vehicle coil component is required to have higher reliability than ever before. To meet this requirement, it is important to form a solder fillet when the coil component is mounted. It is necessary to form a terminal electrode on the outer surface of a flange in order to form a solder fillet; however, eddy current loss increase when a terminal electrode is formed on the outer surface of a flange.

SUMMARY

An object of the present invention is therefore to provide a coil component in which a terminal electrode is provided on the outer surface of the flange thereof and eddy current loss is reduced and a circuit board with the coil component.

A coil component according to the present invention includes:
a drum-shaped core including:
a winding core part, an axial direction of the winding core part being a first direction;
a first flange part provided at one end of the winding core part in the first direction; and
a second flange part provided at other end of the winding core part in the first direction;
first to fourth terminal electrodes formed on the first flange part so as to be arranged in this order in a second direction substantially perpendicular to the first direction;
fifth to eighth terminal electrodes formed on the second flange part so as to be arranged in this order in the second direction; and
first to fourth wires wound around the winding core part, one ends of the first to fourth wires being connected to different ones of the first to fourth terminal electrodes and other ends of the first to fourth wires being connected to different ones of the fifth to eighth terminal electrodes, wherein the first flange part has a first inner side surface connected to the winding core part and a first outer side surface opposite to the first inner side surface, the second flange part has a second inner side surface connected to the winding core part and a second outer side surface opposite to the second inner side surface, the first to fourth terminal electrodes are formed at least on the first outer side surface, the fifth to eighth terminal electrodes are formed at least on the second outer side surface, a distance between the first and second terminal electrodes in the second direction is larger than the distance between the third and fourth terminal electrodes in the second direction, a distance between the fifth and sixth terminal electrodes in the second direction is larger than the distance between the seventh and eighth terminal electrodes in the second direction, a distance between a first virtual line and the third terminal electrode in the second direction is larger than a distance between the first virtual line and the second terminal electrode in the second direction, where the first virtual line is defined on the first outer side surface, extends in a third direction substantially perpendicular to the first and second directions, and whose position in the second direction coincides with the center axis of the winding core part, and a distance between a second virtual line and the seventh terminal electrode in the second direction is larger than a distance between the second virtual line and the sixth terminal electrode in the second direction, where the second virtual line is defined on the second outer side surface, extends in the third direction, and whose position in the second direction coincides with the center axis of the winding core part.

A circuit board according to the present invention includes: a substrate having a plurality of land patterns; the coil component mounted on the substrate; and solders that connect the plurality of land patterns and the first to eighth terminal electrodes. The plurality of land patterns include first, second, third, and fourth land patterns connected respectively to the first, second, fifth, and sixth terminal electrodes, a fifth land pattern connected in common to the third and fourth terminal electrodes, and a sixth land pattern connected in common to the seventh and eighth terminal electrodes.

According to the present invention, the first and second terminal electrodes (or fifth and sixth terminal electrodes) are not symmetrical with the third and fourth terminal electrodes (or seventh and eighth terminal electrodes). That is, the third and fourth terminal electrodes (or seventh and eighth terminal electrodes) are offset outward, so that eddy current loss can be reduced. In addition, a sufficient distance is ensured between the first and second terminal electrodes (or distance between the fifth and sixth terminal electrodes), so that even when these terminal electrodes are connected to mutually different land patterns, occurrence of a short circuit fault can be prevented. Further, the distance between the third and fourth terminal electrodes (distance between the seventh and eighth terminal electrodes) is small, so that when these terminal electrodes are used as a center tap of a pulse transformer, they can be reliably short-circuited by a bridge of the solder.

Preferably, in the present invention, the first to eighth terminal electrodes do not overlap the winding core part as viewed in the first direction. With this configuration, eddy current loss can be further reduced.

Preferably, in the present invention, a distance between the fourth terminal electrode and one end portion of the first outer surface in the second direction is smaller than a distance between the first terminal electrode and other end portion of the first outer surface in the second direction, and a distance between the eighth terminal electrode and one end portion of the second outer surface in the second direction is smaller than the distance between the fifth terminal electrode and other end portion of the second outer surface in the second direction. With this configuration, eddy current loss can be further reduced.

Preferably, in the present invention, the first flange part further has a first bottom surface substantially parallel to the first and second directions, the second flange part further has a second bottom surface substantially parallel to the first and second directions, the first to fourth terminal electrodes are further formed on the first bottom surface, the fifth to eighth terminal electrodes are further formed on the second bottom surface, the one end of each of the first to fourth wires contacts with each of the first to fourth terminal electrodes on the first bottom surface, and the other end of each of the first to fourth wires contacts with each of the fifth to eighth terminal electrodes on the second bottom surface. With this configuration, wire connection can be easily achieved.

In this case, it is preferable that each of the first to fourth terminal electrodes is a L-shaped metal fitting covering the first outer surface and the first bottom surface, and each of the fifth to eighth terminal electrodes is a L-shaped metal fitting covering the second outer surface and the second bottom surface. With this configuration, a manufacturing cost of the coil component can be reduced.

Preferably, in the present invention, the coil component further has a plate core, wherein the first flange part further has a first top surface opposite to the first bottom surface, the second flange part further has a second top surface opposite to the second bottom surface, and the plate core is bonded to the first and second top surfaces. With this configuration, high magnetic characteristics can be obtained.

According to the present invention, eddy current caused by the terminal electrodes provided on the outer side surface of the flange part can be prevented, so that it is possible to provide a coil component with less eddy current loss and a circuit board provided with the coil component.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
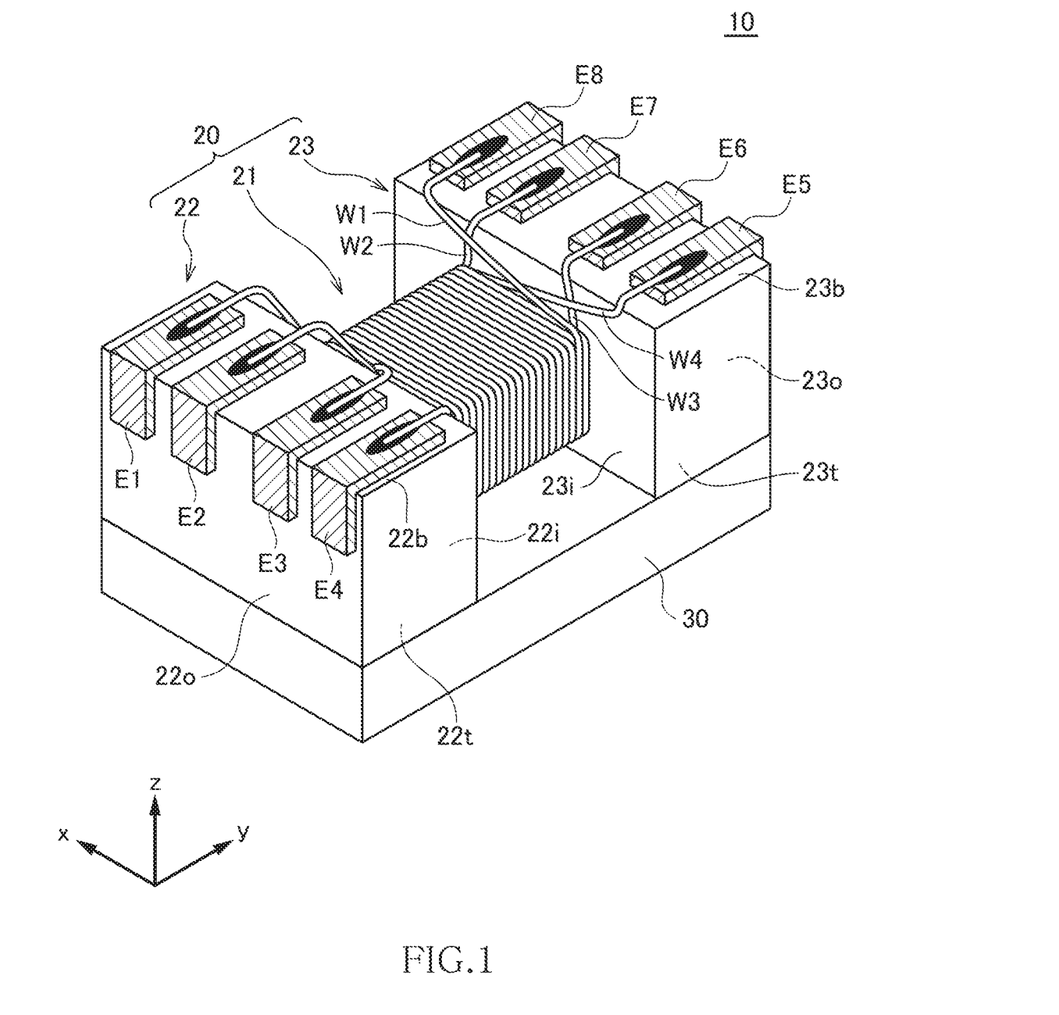
FIG. 1 is a schematic perspective view illustrating an external structure of a coil component according to a preferred embodiment of the present invention.

FIG. 1 is a schematic perspective view illustrating an external structure of a coil component 10 according to a preferred embodiment of the present invention.

The coil component 10 according to the present embodiment is a surface-mount type pulse transformer. As illustrated in FIG. 1, the coil component 10 includes a drum-shaped core 20, a plate core 30 bonded to the drum-shaped core 20, and wires W1 to W4 wound around a winding core part 21 of the drum-shaped core 20. The coil component according to the present invention is not limited to a pulse transformer, but may be other transformer components such as a balun transformer and a booster transformer or filter components such as a common mode choke coil.

The drum-shaped core 20 and the plate core 30 are formed of a magnetic material having comparatively high permeability, such as a sintered body of a Ni—Zn ferrite or Mn—Zn ferrite. In general, a magnetic material having high permeability, such as Mn—Zn ferrite, is low in specific resistance and has conductivity.

The drum-shaped core 20 has a rod-like winding core part 21 whose axial direction is the y-direction, and first and second flange parts 22 and 23 provided at both ends of the winding core part 21 in the y-direction. The winding core part 21 and flange parts 22 and 23 are integrally formed. The flange part 22 has an inner side surface 22$i$ connected to the winding core part 21, an outer side surface 22$o$ positioned on the opposite side of the inner side surface 22$i$, a bottom surface 22$b$ extending parallel to the axial direction of the winding core part 21, and a top surface 22$t$ positioned on the opposite side of the bottom surface 22$b$. Similarly, the flange part 23 has an inner side surface 23$i$ connected to the winding core part 21, an outer side surface 23$o$ positioned on the opposite side of the inner side surface 23$i$, a bottom surface 23$b$ extending parallel to the axial direction of the winding core part 21, and a top surface 23$t$ positioned on the opposite side of the bottom surface 23$b$. The inner side surfaces 22$i$ and 23$i$ and the outer side surfaces 22$o$ and 23$o$ constitute the xz plane, and bottom surfaces 22$b$ and 23$b$ and the top surfaces 22$t$ and 23$t$ constitute the xy plane.

The coil component 10 is a component surface-mounted on a printed circuit board at actual use time and is mounted with bottom surfaces 22$b$ and 23$b$ of the respective flange parts 22 and 23 facing the printed circuit board. The plate core 30 is bonded by adhesive to the top surfaces 22$t$ and 23$t$ of the respective flange parts 22 and 23. With such a configuration, the drum-shaped core 20 and the plate core 30 constitute a closed magnetic path.

As illustrated in FIG. 1, first to fourth terminal electrodes E1 to E4 are arranged in this order in the x-direction on the bottom surface 22$b$ and outer side surface 22$o$ of the flange part 22, and the fifth to eighth terminal electrodes E5 to E8 are arranged in this order in the x-direction on the bottom surface 23$b$ and outer side surface 23$o$ of the flange part 23. The terminal electrodes E1 to E8 are terminal metal fittings having an L-shape and bonded to the flange part 22 or 23 through an adhesive. By using the L-shaped terminal metal fitting, it is possible to reduce production cost as compared with a case where the terminal electrode E1 to E8 is formed by baking metal paste thereonto.

The four wires W1 to W4 are wound around the winding core part 21. One ends of the wires W1 to W4 are connected to different ones of the terminal electrodes E1 to E4, and the other ends of the wires W1 to W4 are connected to different ones of the terminal electrodes E5 to E8. The wires W1 to W4 are each connected to a part of the terminal electrode that covers the bottom surface 22b or 23b. Although not especially limited, the connection can be achieved by thermocompression or laser joining.

Although not especially limited, the wire W1 is connected to the terminal electrodes E1 and E8, and the winding direction thereof is, e.g., clockwise. The wire W2 is connected to the terminal electrodes E2 and E7, and the winding direction thereof is, e.g., counterclockwise. The wire W3 is connected to the terminal electrodes E3 and E6, and the winding direction thereof is, e.g., clockwise. The wire W4 is connected to the terminal electrodes E4 and E5, and the winding direction thereof is, e.g., counterclockwise.

Figure 2:
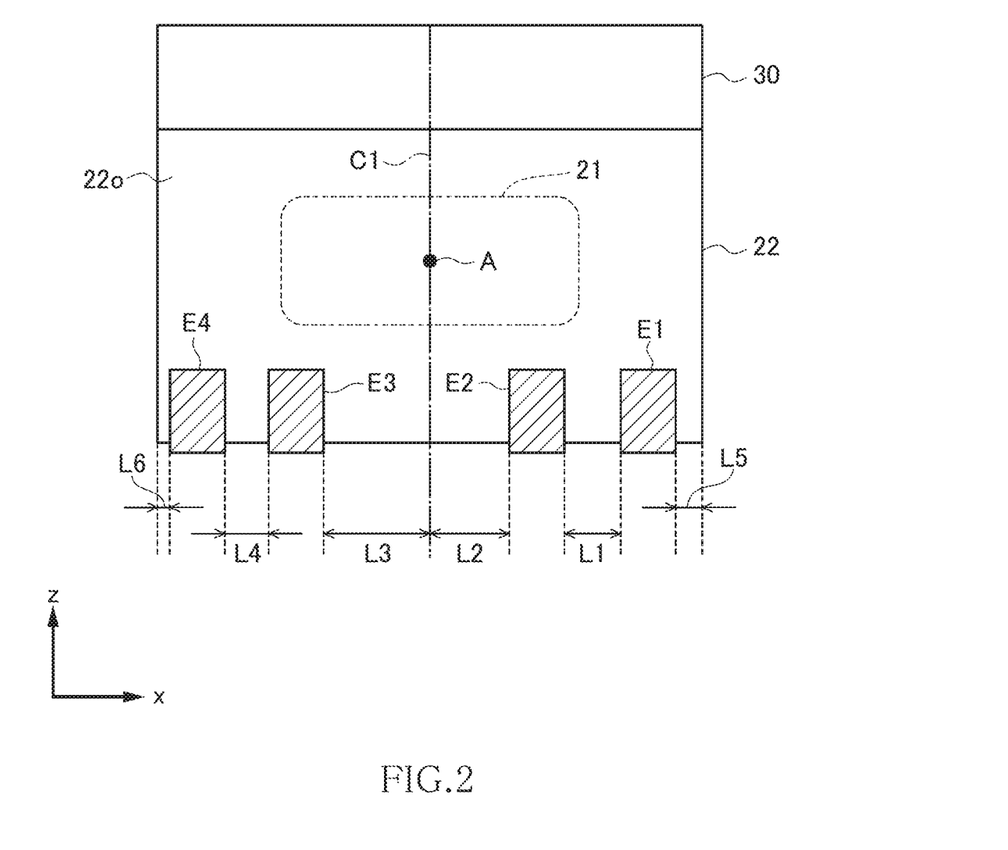
FIGS. 2 and 3 are side views of the coil component shown in FIG. 1 as seen from the y-direction.
Figure 3:
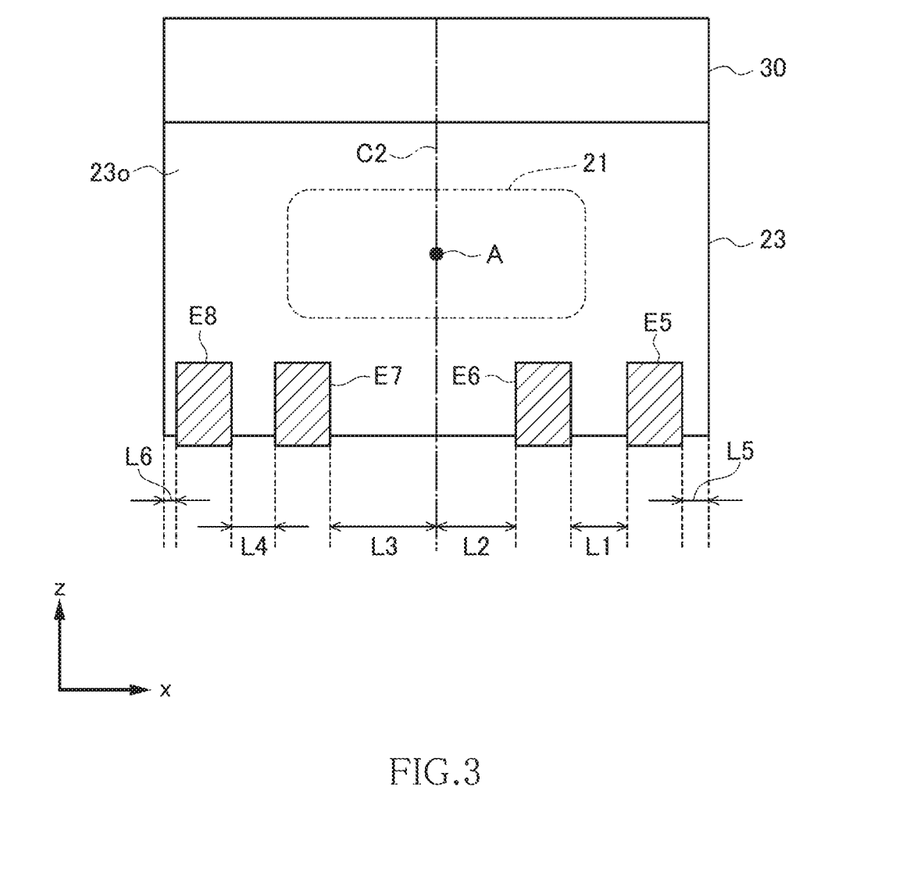

FIGS. 2 and 3 are each a side view of the coil component 10 as seen from the y-direction. More specifically, FIG. 2 is a view as observed from the flange part 22 side, and FIG. 3 is a view as observed from the flange part 23 side.

FIG. 2 illustrates in detail the layout of the terminal electrodes E1 to E4. Assuming that the distance between the terminal electrodes E1 and E2 in the x-direction is L1 and that the distance between the terminal electrodes E3 and E4 in the x-direction is L4, the coil component 10 according to the present embodiment satisfies L1>L4.

Assume that a virtual line C1 that passes a center axis A of the winding core part 21 and extends in the z-direction is defined on the outer side surface 22o. In this case, assuming that the distance between the virtual line C1 and the terminal electrode E2 in the x-direction is L2, and the distance between the virtual line C1 and the terminal electrode E3 in the x-direction is L3, the coil component 10 according to the present embodiment satisfies L2<L3. Further, L1<L2+L3 is satisfied.

Further, the distance between an x-direction right side end portion of the outer side surface 22o and the terminal electrode E1 in the x-direction is L5, and the distance between an x-direction left side end portion of the outer side surface 22o and the terminal electrode E4 in the x-direction is L6, the coil component 10 according to the present embodiment satisfies L5>L6.

Further, each of the terminal electrodes E1 to E4 is designed short in z-direction length so as not to overlap the winding core part 21 as viewed from the y-direction.

FIG. 3 illustrates in detail the layout of the terminal electrodes E5 to E8. Assuming that the distance between the terminal electrodes E5 and E6 in the x-direction is L1 and that the distance between the terminal electrodes E7 and E8 in the x-direction is L4, the coil component 10 according to the present embodiment satisfies L1>L4.

Assume that a virtual line C2 that passes the center axis A of the winding core part 21 and extends in the z-direction is defined on the outer side surface 23o. In this case, assuming that the distance between the virtual line C2 and the terminal electrode E6 in the x-direction is L2, and the distance between the virtual line C2 and the terminal electrode E7 in the x-direction is L3, the coil component 10 according to the present embodiment satisfies L2<L3. Further, L1<L2+L3 is satisfied.

Further, the distance between an x-direction right side end portion of the outer side surface 23o and the terminal electrode E5 in the x-direction is L5, and the distance between an x-direction left side end portion of the outer side surface 23o and the terminal electrode E8 in the x-direction is L6, the coil component 10 according to the present embodiment satisfies L5>L6.

Further, each of the terminal electrodes E5 to E8 is designed short in z-direction length so as not to overlap the winding core part 21 as viewed from the y-direction.

In the present embodiment, the terminal electrodes E1 to E8 are arranged in the above-described layout, so that when, for example, the terminal electrodes E1 and E2 are used as a primary side input/output terminal of the pulse transformer, the terminal electrodes E5 and E6 are used as a secondary side input/output terminal of the pulse transformer, the terminal electrodes E7 and E8 are used as a primary side center tap of the pulse transformer, and the terminal electrodes E3 and E4 are used as a secondary side center tap, it is possible to reduce eddy current loss while ensuring the withstand voltage between the primary and secondary sides. The withstand voltage between the primary and secondary sides can be ensured by increasing the distance (L2+L3) with respect to the distance L1 or L2.

The eddy current is generated when a magnetic flux caused by current flowing in the wires W1 to W4 crosses the terminal electrodes E1 to E8. The coil component 10 according to the present embodiment is laid out such that the terminal electrodes E1 to E8 do not overlap the winding core part 21 as viewed in the y-direction, so that occurrence of the eddy current can be suppressed.

In order to suppress occurrence of the eddy current as much as possible in the configuration where terminal electrodes E1 to E8 do not overlap the winding core part 21 as viewed in the y-direction, the planar positions of the terminal electrodes E1 to E8 as viewed from the y-direction should preferably be separate from the center axis A of the winding core part 21 as much as possible. This configuration is achieved by, for example, disposing the terminal electrodes E1 and E2 as close to the right side of FIG. 2 as possible, and the terminal electrodes E3 and E4 as close to the left side of FIG. 2 as possible. However, when the terminal electrodes E1 and E2 are used respectively as the primary side input/output terminals of the pulse transformer, if the distance L1 between them is made excessively small, the primary side input/output terminal pair may be short-circuited. Thus, it is necessary to ensure a certain size for the distance L1 between the terminal electrodes E1 and E2.

On the other hand, when being used as the secondary side center taps of the pulse transformer, the terminal electrodes E3 and E4 are applied with the same potential. Thus, the distance L4 between the terminal electrodes E3 and E4 can be smaller than the distance L1 (L1>L4). As a result, the terminal electrode E3 can be offset more outward than the terminal electrode E2 (L3>L2). This allows the distance between the terminal electrodes E3, E4 and the center axis A of the winding core part 21 to be large, so that it is possible to reduce eddy current generated in the terminal electrodes E3 and E4.

In addition, when the terminal electrodes E3 and E4 are used as the secondary side center taps of the pulse transformer, they have the same potential. Thus, the terminal electrodes E3 and E4 have a higher degree of freedom in layout design than the terminal electrodes E1 and E2. By utilizing this point, the terminal electrode E4 is disposed closer to the end portion (L5>L6) in the present embodiment, thereby enabling further reduction of eddy current generated in the terminal electrodes E3 and E4.

The same is applied to the terminal electrodes E5 to E8. That is, the terminal electrode E7 is offset more outward than the terminal electrode E6, enabling reduction of eddy current generated in the terminal electrodes E7 and E8. In addition, the terminal electrode E8 is disposed closer to the end portion, thereby enabling further reduction of eddy current generated in the terminal electrodes E7 and E8.

This is the structure of the coil component 10 according to the present embodiment.

Figure 4:
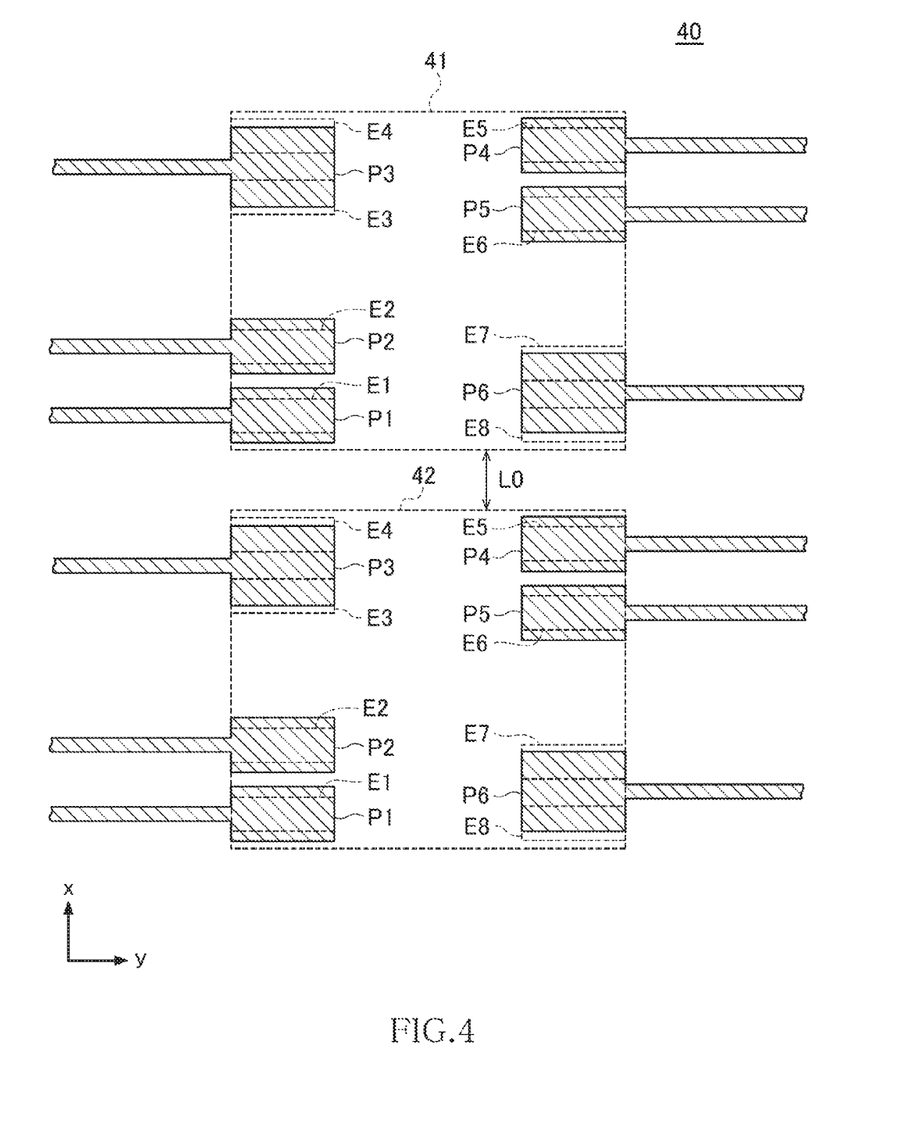
FIG. 4 is a plan view illustrating a conductor pattern on a substrate on which the coil component is mounted.

FIG. 4 is a plan view illustrating a conductor pattern on a substrate on which the coil component 10 is mounted.

In the example of FIG. 4, mounting regions 41 and 42 are assigned to a substrate 40, and two coil components 10 are mounted in the mounting regions 41 and 42. The mounting regions 41 and 42 are laid out in proximity in the x-direction to each other for high density mounting on the substrate 40. Specifically, the distance between the mounting regions 41 and 42 in the x-direction is L0. The minimum value of the distance L0 is restricted by required reliability, specification, mounting accuracy, or the like.

Figure 5:
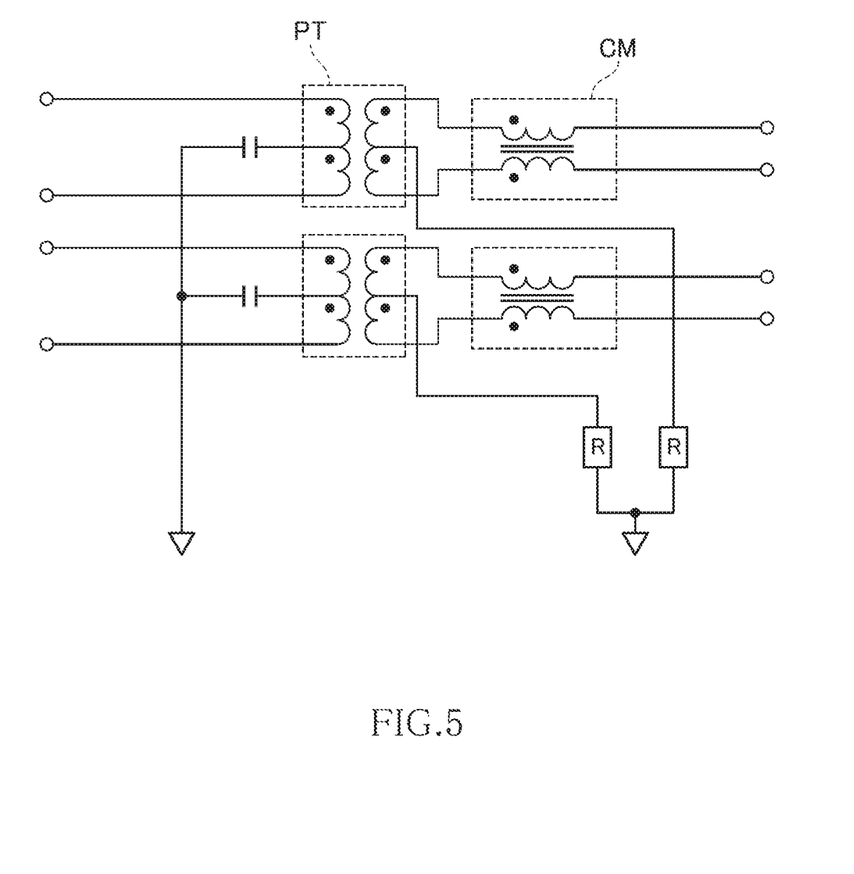
FIG. 5 is a circuit diagram of a LAN connector circuit (100Base)
Figure 6:
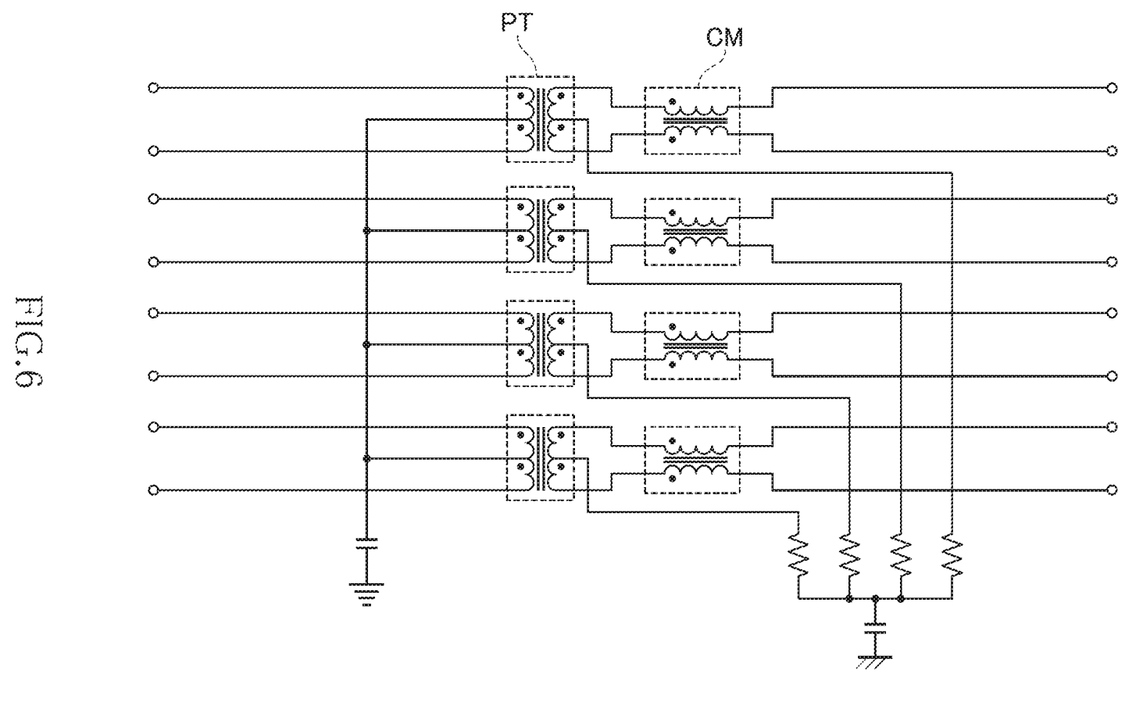
FIG. 6 is a circuit diagram of a LAN connector circuit (1000Base)

Such a layout is required in, for example, a LAN connector circuit (100Base) illustrated in FIG. 5 and a LAN connector circuit (1000Base) illustrated in FIG. 6, when the coil component 10 according to the present embodiment is a pulse transformer. As illustrated in FIGS. 5 and 6, these LAN connector circuits each use a plurality of pulse transformers PT, so that when the coil components 10 are mounted at high density, the mounting regions 41 and 42 may be in proximity to each other as illustrated in FIG. 4.

Land patterns P1 to P6 to be connected to the terminal electrodes E1 to E8 by a solder are provided on the mounting regions 41 and 42. Specifically, the land patterns P1, P2, P4, and P5 are connected respectively to the terminal electrodes E1, E2, E5, and E6. The land pattern P3 is connected to the terminal electrodes E3 and E4. The land pattern P6 is connected to the terminal electrodes E7 and E8. With this configuration, the terminal electrodes E1 and E2 can be used as a primary side input/output terminal of the pulse transformer, the terminal electrodes E5 and E6 can be used as a secondary side input/output terminal of the pulse transformer, the terminal electrodes E7 and E8 can be used as a primary side center tap of the pulse transformer, and the terminal electrodes E3 and E4 can be used as a secondary side center tap.

As illustrated in FIG. 4, the width of each of the land patterns P3 and P6 in the x-direction is larger than that of each of the land patterns P1, P2, P4 and P5. This is because two terminal electrodes (e.g., E3 and E4) are connected to one land pattern (e.g., P3). However, each of the land patterns P3 and P6 does not necessarily have to cover the whole of its corresponding two terminal electrodes in the x-direction, and is only required to cover only a part thereof, as illustrated in FIG. 4. With this configuration, even when the distance L0 between the mounting regions 41 and 42 is small, and when the distance L6 between each of the terminal electrodes E4 and E8 and the edge of each of the mounting regions 41 and 42 is small, it is possible to ensure the distance between the land pattern P1 provided in the mounting region 41 and the land pattern P3 provided in the mounting region 42 in the x-direction, and the distance between the land pattern P6 provided in the mounting region 41 and the land pattern P4 provided in the mounting region 42 in the x-direction.

Figure 7:
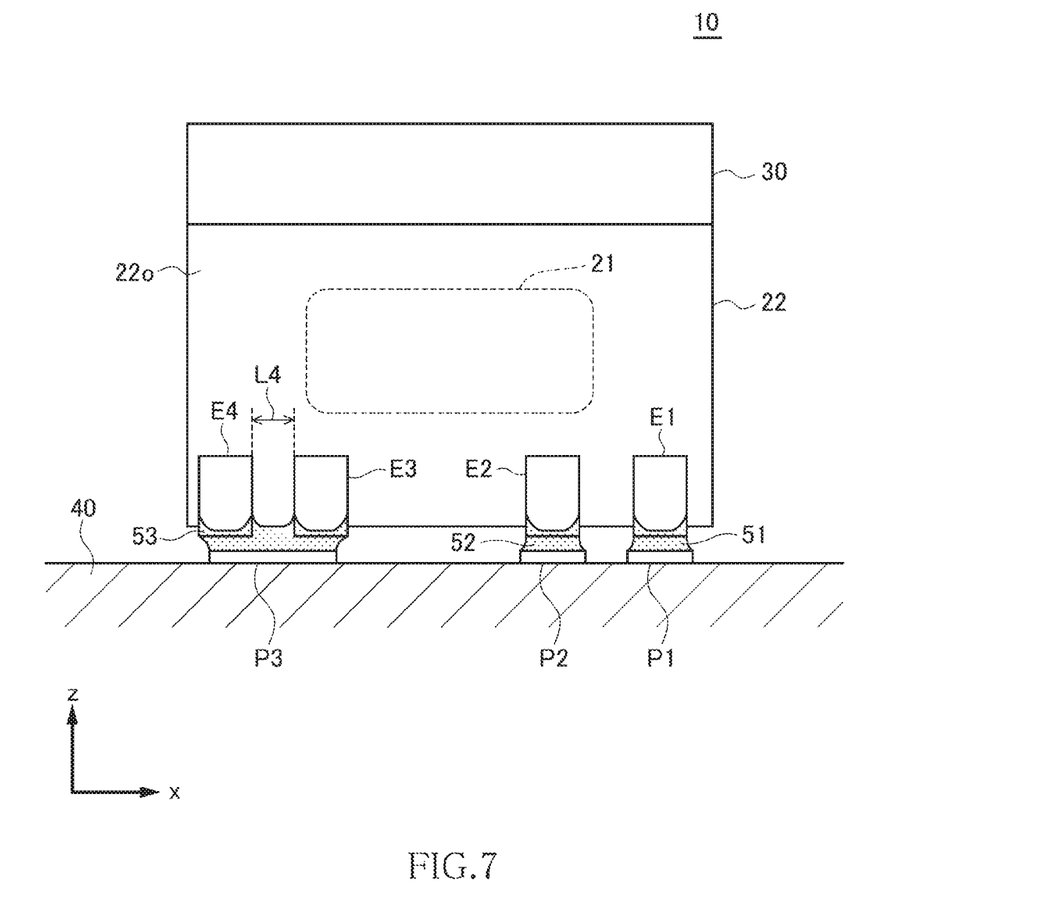
FIG. 7 is a side view of the coil component mounted on the substrate.

FIG. 7 is a side view of the coil component 10 mounted on the substrate 40.

In the example of FIG. 7, the terminal electrode E1 and the land pattern P1 are connected by a solder 51, the terminal electrode E2 and the land pattern P2 are connected by a solder 52, the terminal electrodes E3 and E4 and the land pattern P3 are connected by a solder 53. Each of the land patterns P1 and P2 has a size larger in the x-direction than that of the corresponding one of the terminal electrodes E1 and E2. The land pattern P3 is disposed so as to cover the interval between the terminal electrodes E3 and E4. The solders 51 to 53 supplied respectively to the land patterns P1 to P3 cover the surfaces of the terminal electrodes E1 to E4 that extend in the z-direction on the outer surface 22o of the flange part 22 to form fillets. This increases bonding strength of the coil component 10 with respect to the substrate 40, thereby increasing reliability of the circuit board.

Further, the fillet of the solder 53 forms a bridge that directly connects the terminal electrodes E3 and E4. Such a bridge can be easily formed when the distance L4 between the terminal electrodes E3 and E4 is small. Thus, short-circuit between the terminal electrodes E3 and E4 is achieved not only through the land pattern P3 but through the bridge of the solder 53. Hence, the short-circuit therebetween is made more reliable.

It is apparent that the present invention is not limited to the above embodiments, but may be modified and changed without departing from the scope and spirit of the invention.

For example, in the coil component 10 according to the above embodiment, the L-shaped terminal metal fittings are used as the terminal electrodes E1 to E8; alternatively, the terminal electrodes E1 to E8 may be formed by baking metal paste onto the flange parts 22 and 23.

Further, the coil component 10 according to the above embodiment has the plate core 30, but it is not essential for the coil component 10 according to the present invention to have the plate core 30. Even in the case of providing the plate core 30, it is not essential for the plate core 30 to be provided on the top surfaces 22t and 23t of the respective flange parts 22 and 23, as in the case of the first embodiment, but the plate core 30 may be provided on the yz side surfaces of the respective flange parts 22 and 23 so as to connect the flange parts 22 and 23. Further alternatively, the plate core 30 may be provided on the top surfaces 22t and 23t and yz side surfaces of the respective flange parts 22 and 23. In this case, a plate core having an L-shaped cross section obtained by integrally forming a part that covers the top surfaces 22t and 23t and a part that covers the yz side surfaces may be used.

Further, it is not essential for each of the terminal electrodes E1 to E8 to have an L-shape. For example, the terminal electrodes E1 to E4 may be formed into a U-like shape that covers also the top surface 22t of the flange part 22, and the terminal electrodes E5 to E8 may be formed into a U-like shape that covers also the top surface 23t of the flange part 23.

What is claimed is:

1. A coil component comprising:
   a drum-shaped core including:
      a winding core part, an axial direction of the winding core part being a first direction;
      a first flange part provided at one end of the winding core part in the first direction; and
      a second flange part provided at other end of the winding core part in the first direction;
   first to fourth terminal electrodes formed on the first flange part so as to be arranged in this order in a second direction substantially perpendicular to the first direction;
   fifth to eighth terminal electrodes formed on the second flange part so as to be arranged in this order in the second direction; and
   first to fourth wires wound around the winding core part, one ends of the first to fourth wires being connected to different ones of the first to fourth terminal electrodes and other ends of the first to fourth wires being connected to different ones of the fifth to eighth terminal electrodes, wherein the first flange part has a first inner side surface connected to the winding core part and a first outer side surface opposite to the first inner side surface, the second flange part has a second inner side surface connected to the winding core part and a second outer side surface opposite to the second inner side surface, the first to fourth terminal electrodes are formed at least on the first outer side surface, the fifth to eighth terminal electrodes are formed at least on the second outer side surface, a distance between the first and second terminal electrodes in the second direction is larger than the distance between the third and fourth terminal electrodes in the second direction, a distance between the fifth and sixth terminal electrodes in the second direction is larger than the distance between the seventh and eighth terminal electrodes in the second direction, a distance between a first virtual line and the third terminal electrode in the second direction is larger than a distance between the first virtual line and the second terminal electrode in the second direction, where the first virtual line is defined on the first outer side surface, extends in a third direction substantially perpendicular to the first and second directions, and whose position in the second direction coincides with the center axis of the winding core part, and a distance between a second virtual line and the seventh terminal electrode in the second direction is larger than a distance between the second virtual line and the sixth terminal electrode in the second direction, where the second virtual line is defined on the second outer side surface, extends in the third direction, and whose position in the second direction coincides with the center axis of the winding core part.

2. The coil component as claimed in claim 1, wherein the first to eighth terminal electrodes do not overlap the winding core part as viewed in the first direction.

3. The coil component as claimed in claim 1, wherein
a distance between the fourth terminal electrode and one end portion of the first outer surface in the second direction is smaller than a distance between the first terminal electrode and other end portion of the first outer surface in the second direction, and a distance between the eighth terminal electrode and one end portion of the second outer surface in the second direction is smaller than the distance between the fifth terminal electrode and other end portion of the second outer surface in the second direction.

4. The coil component as claimed in claim 1, wherein
the first flange part further has a first bottom surface substantially parallel to the first and second directions, the second flange part further has a second bottom surface substantially parallel to the first and second directions, the first to fourth terminal electrodes are further formed on the first bottom surface, the fifth to eighth terminal electrodes are further formed on the second bottom surface, the one end of each of the first to fourth wires contacts with each of the first to fourth terminal electrodes on the first bottom surface, and the other end of each of the first to fourth wires contacts with each of the fifth to eighth terminal electrodes on the second bottom surface.

5. The coil component as claimed in claim 4, wherein
each of the first to fourth terminal electrodes is a L-shaped metal fitting covering the first outer surface and the first bottom surface, and each of the fifth to eighth terminal electrodes is a L-shaped metal fitting covering the second outer surface and the second bottom surface.

6. The coil component as claimed in claim 4, further comprising a plate core, wherein
the first flange part further has a first top surface opposite to the first bottom surface, the second flange part further has a second top surface opposite to the second bottom surface, and the plate core is bonded to the first and second top surfaces.

* * * * *